(12) United States Patent
Kim

(10) Patent No.: US 11,694,729 B2
(45) Date of Patent: Jul. 4, 2023

(54) PIPE LATCH CIRCUIT FOR EXECUTING CONSECUTIVE DATA OUTPUT OPERATION

(71) Applicant: SK hynix Inc., Icheon-si Gyeonggi-do (KR)

(72) Inventor: Kwang Soon Kim, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 17/395,809

(22) Filed: Aug. 6, 2021

(65) Prior Publication Data

US 2022/0358974 A1 Nov. 10, 2022

(30) Foreign Application Priority Data

May 10, 2021 (KR) .................. 10-2021-0060349

(51) Int. Cl.
*G11C 7/00* (2006.01)
*G11C 7/10* (2006.01)
*G11C 7/22* (2006.01)

(52) U.S. Cl.
CPC ............ *G11C 7/1039* (2013.01); *G11C 7/106* (2013.01); *G11C 7/22* (2013.01); *G11C 7/1066* (2013.01)

(58) Field of Classification Search
CPC .................................................... G11C 7/1039
USPC ................................................... 365/198.05
See application file for complete search history.

(56) References Cited

U.S. PATENT DOCUMENTS

2005/0185484 A1\* 8/2005 Jang ................. G11C 29/50012
365/201
2007/0223287 A1 9/2007 Lee

FOREIGN PATENT DOCUMENTS

KR 1020020055934 A 7/2002

\* cited by examiner

*Primary Examiner* — Hoai V Ho
(74) *Attorney, Agent, or Firm* — William Park & Associates Ltd.

(57) ABSTRACT

A pipe latch circuit includes a data latch circuit configured to latch an input data based on an input control signal and output the latched input data as a latch data based on an output control signal, a sense amplification circuit configured to sense and amplify the latch data based on a sum output control signal, and a data driving circuit configured to drive an output data from the latch data based on the sum output control signal.

20 Claims, 17 Drawing Sheets

PIPE LATCH CIRCUIT FOR EXECUTING CONSECUTIVE DATA OUTPUT OPERATION

CROSS-REFERENCE TO RELATED APPLICATIONS

The present application claims priority under 35 U.S.C 119(a) to Korean Applications No. 10-2021-0060349, filed on May 10, 2021, which is incorporated herein by reference in its entirety.

BACKGROUND

1. Technical Field

The present disclosure generally relates to a semiconductor device including a pipe latch circuit.

2. Related Art

In general, a semiconductor device includes a pipe latch circuit to output consecutive data. The pipe latch circuit is a circuit that stores data transmitted from a memory cell array and sequentially outputs the data in synchronization with a clock signal. The number of data latches in the pipe latch circuit varies according to the amount of data to be input and latched, and the number of the data latches constituting the pipe latch circuit is determined by latency information of a semiconductor device, or the like. Meanwhile, the data latches included in the pipe latch circuit may be connected in series or may be connected in parallel to each other.

SUMMARY

According to an embodiment of the present disclosure, there may be provided an electronic device including a data latch circuit configured to latch an input data based on an input control signal and output the latched input data as a latch data based on an output control signal; a sense amplification circuit configured to sense and amplify the latch data based on a sum output control signal; and a data driving circuit configured to drive an output data from the latch data based on the sum output control signal.

In addition, according to another embodiment of the present disclosure, there may be provided an electronic device including a first data latch configured to latch an input data to a first node when a pulse of a first bit of an input control signal is generated and output the input data that is latched to the first node as a latch data when a pulse of a first bit of an output control signal is generated; a second data latch configured to latch the input data to a second node when a pulse of a second bit of the input control signal is generated and output the input data that is latched to the second node as the latch data when a pulse of a second bit of the output control signal is generated; and a sense amplification circuit configured to sense and amplify the latch data to drive an output data based on a sum output control signal.

In addition, according to another embodiment of the present disclosure, there may be provided a method of performing a consecutive data output operations including latching an input data and an inverted input data based on an input control signal, outputting the latched input data as a latch data based on an output control signal, and outputting the latched inverted input data as an inverted latch data; sensing and amplifying the latch data and the inverted latch data based on a sum output control signal; and driving an output data from the latch data and the inverted latch data based on the sum output control signal.

DETAILED DESCRIPTION

In the following description of embodiments, when a parameter is referred to as being "predetermined," it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
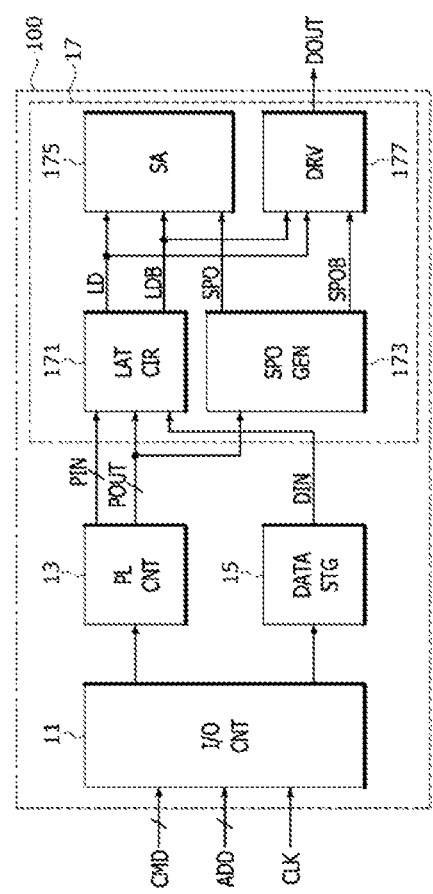
FIG. 1 is a block diagram illustrating a configuration of a semiconductor device according to an embodiment of the present disclosure.

FIG. 1 is a block diagram illustrating a configuration of a semiconductor device 100 according to an embodiment of the present disclosure. As illustrated in FIG. 1, the semiconductor device 100 may include an input/output control circuit (I/O CNT) 11, a pipe latch control circuit (PL CNT) 13, a data storage circuit (DATA STG) 15, and a pipe latch circuit 17.

The input/output control circuit 11 may receive a command CMD, an address ADD, and a clock CLK from an external device of the semiconductor device 100. The external device of the semiconductor device 100 may be a semiconductor controller (not illustrated) or a test device (not illustrated). The input/output control circuit 11 may include a command decoder (not illustrated) that decodes the command CMD, and an address decoder (not illustrated) that decodes the address ADD. The input/output control circuit 11 may control the pipe latch control circuit 13 and the data storage circuit 15 in order to control an operation in which data is input/output to/from the pipe latch circuit 17, based on the command CMD, the address ADD, and the clock CLK. The input/output control circuit 11 may control the data storage circuit 15 so that input data DIN is output from the data storage circuit 15. The input/output control circuit 11 may control the pipe latch control circuit 13 so that the input data DIN that is output from the data storage circuit 15 is input to a data latch circuit 171 that is included in the pipe latch circuit 17. The input/output control circuit 11 may control the pipe latch control circuit 13 so that the data that is input to the data latch circuit 171 is output.

The pipe latch control circuit 13 may be controlled by the input/output control circuit 11 to generate an input control signal PIN and an output control signal POUT for an operation in which data is input/output to/from the pipe latch circuit 17. The pipe latch control circuit 13 may be controlled by the input/output control circuit 11 to generate the input control signal PIN for inputting the input data DIN to the data latch circuit 171. The pipe latch control circuit 13 may be controlled by the input/output control circuit 11 to generate the output control signal POUT for outputting the latched data from the data latch circuit 171. Each of the input control signal PIN and output control signal POUT may include a plurality of bits, and the number of the bits that are included in each of the input control signal PIN and output control signal POUT may be variously set according to embodiments.

The data storage circuit 15 may be controlled by the input/output control circuit 11 to output the input data DIN to be input to the pipe latch circuit 17. The data storage circuit 15 may include a memory cell array that is accessed by the address ADD input to the input/output control circuit 11. According to embodiments, the data storage circuit 15 may be implemented with a buffer memory.

The pipe latch circuit 17 may receive the input control signal PIN and the output control signal POUT from the pipe latch control circuit 13. The pipe latch circuit 17 may receive the input data DIN from the data storage circuit 15. The pipe latch circuit 17 may latch the input data DIN based on the input control signal PIN. The pipe latch circuit 17 may generate a latch data LD and an inverted latch data LDB from the latched input data DIN based on the output control signal POUT. The pipe latch circuit 17 may sense and amplify the latch data LD and the inverted latch data LDB based on the output control signal POUT. The pipe latch circuit 17 may drive an output data DOUT based on the sensed and amplified latch data LD and inverted latch data LDB and based on the output control signal POUT. The pipe latch circuit 17 may include a data latch circuit (LAT CTR) 171, a sum output control signal generation circuit (SPO GEN) 173, a sense amplification circuit 175, and a data driving circuit (DRV) 177.

The data latch circuit 171 may receive the input control signal PIN and the output control signal POUT from the pipe latch control circuit 13, receive the input data DIN from the data storage circuit 15, and inversely buffer the input data DIN to generate an inverted input data DINB. The data latch circuit 171 may latch the input data DIN and the inverted input data DINB based on the input control signal PIN. The data latch circuit 171 may output the latched input data DIN and inverted input data DINB as the latch data LD and the inverted latch data LDB based on the output control signal POUT.

The sum output control signal generation circuit 173 may receive the output control signal POUT from the pipe latch control circuit 13. The sum output control signal generation circuit 173 may generate a sum output control signal SPO and an inverted sum output control signal SPOB based on the output control signal POUT. The sum output control signal generation circuit 173 may generate the sum output control signal SPO with pulses that are generated in synchronization with pulses of the bits that are included in the output control signal POUT. The sum output control signal generation circuit 173 may inversely buffer the sum output control signal SPO to generate the inverted sum output control signal SPOB.

The sense amplification circuit 175 may receive the latch data LD and the inverted latch data LDB from the data latch circuit 171. The sense amplification circuit 175 may receive the sum output control signal SPO from the sum output control signal generation circuit 173. The sense amplification circuit 175 may sense and amplify the latch data LD and the inverted latch data LDB based on the sum output control signal SPO. The sense amplification circuit 175 may sense and amplify the latch data LD and the inverted latch data LDB when the pulse of the sum output control signal SPO is generated.

The data driving circuit 177 may receive the latch data LD and the inverted latch data LDB from the data latch circuit 171. The data driving circuit 177 may receive the inverted sum output control signal SPOB from the sum output control signal generation circuit 173. The data driving circuit 177 may drive the output data DOUT, based on the inverted sum output control signal SPOB, the latch data LD, and the inverted latch data LDB. The sense amplification circuit 175 may drive the output data DOUT according to the latch data LD and the inverted latch data LDB that are sensed and amplified by the sense amplification circuit 175 when a pulse of the inverted sum output control signal SPOB is generated.

Figure 2:
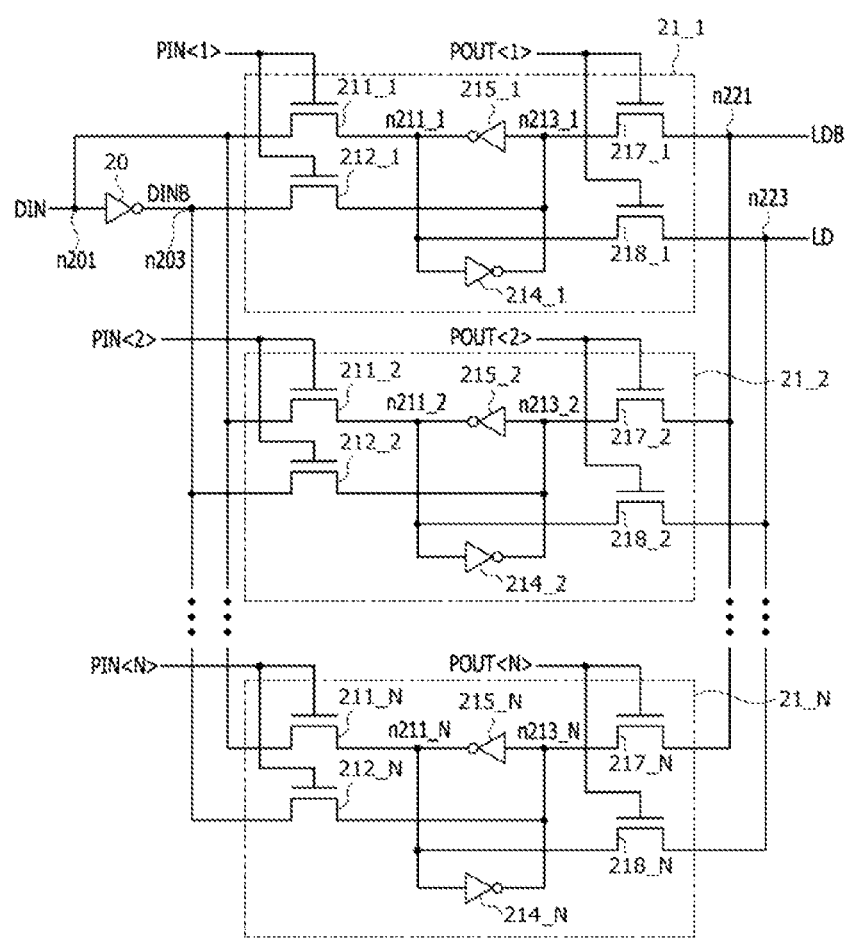
FIG. 2 is a circuit diagram according to an embodiment of a data latch circuit that is included in the semiconductor device illustrated in FIG. 1.

FIG. 2 is a circuit diagram according to an embodiment of a data latch circuit 171. As illustrated in FIG. 2, the data latch circuit 171 may include an inverter 20 and first to $N^{th}$ data latches 21_1~21_N. The inverter 20 may inversely buffer an input data DIN input through a node n201 to generate an inverted input data DINB and output the inverted input data DINB to a node n203.

The first data latch 21_1 may include NMOS transistors 211_1, 212_1, 217_1, and 218_1 and inverters 214_1 and 215_1. The NMOS transistor 211_1 may be connected between the node n201 and a node 211_1 and may be turned on when a pulse of a first bit PIN<1> that is included in an input control signal PIN is generated. The input data DIN input through the node n201 may be transferred to the node n211_1 and latched when the NMOS transistor 211_1 is turned on. The NMOS transistor 212_1 may be connected between the node n203 and a node n213_1 and may be turned on when a pulse of the first bit PIN<1> that is included in the input control signal PIN is generated. The inverted input data DINB of the node n203 may be transferred to the node n213_1 and latched when the NMOS transistor 212_1 is turned on. The inverter 214_1 may inversely buffer the signal of the node n211_1 to output an inversely buffered signal to the node n213_1. The inverter 215_1 may inversely buffer the signal of the node n213_1 to output an inversely buffered signal to the node n211_1. The inverters 214_1 and 215_1 may latch the signal of the node n211_1 and the signal of the node n213_1. The NMOS transistor 217_1 may be connected between the node n213_1 and a node n221 and may be turned on when a pulse of the first bit POUT<1> that is included in the output control signal POUT is generated. The inverted input data DINB latched to the node n213_1 may be output as the inverted latch data LDB of the node n221 when the NMOS transistor 217_1 is turned on. The NMOS transistor 218_1 may be connected between the node n211_1 and a node n223 and may be turned on when a pulse of the first bit POUT<1> that is included in the output control signal POUT is generated. The input data DIN latched to the node n211_1 may be output as the latch data LD when the NMOS transistor 218_1 is turned on.

The second data latch 21_2 may include NMOS transistors 211_2, 212_2, 217_2 and 218_2 and inverters 214_2 and 215_2. The NMOS transistor 211_2 may be connected between the node n201 and a node n211_2 and may be turned on when a pulse of a second bit PIN<2> that is included in the input control signal PIN is generated. The input data DIN input through the node n201 may be transferred to the node n211_2 and latched when the NMOS transistor 211_2 is turned on. The NMOS transistor 212_2 may be connected between the node n203 and a node n213_2 and may be turned on when a pulse of a second bit PIN<2> that is included in the input control signal PIN is generated. The inverted input data DINB of the node n203 may be transferred to the node n213_2 and latched when the NMOS transistor 212_2 is turned on. The inverter 214_2 may inversely buffer the signal of the node n211_2 and output an inversely buffered signal to the node nd213_2. The inverter 215_2 may inversely buffer the signal of the node nd213_2 and output an inversely buffered signal to the node n211_2. The inverters 214_2 and 215_2 may latch the signal of the node n211_2 and the signal of the node nd213_2. The NMOS transistor 217_2 may be connected between the node n213_2 and the node n221 and may be turned on when a pulse of the second bit POUT<2> that is included in the output control signal POUT is generated. The inverted input data DINB latched to the node n213_2 may be output as the inverted latch data LDB of the node n221 when the NMOS transistor 217_2 is turned on. The NMOS transistor 218_2 may be connected between the node n211_2 and the node n223 and may be turned on when a pulse of the second bit POUT<2> that is included in the output control signal POUT is generated. The input data DIN latched to the node n211_2 may be output as the latch data LD when the NMOS transistor 218_2 is turned on.

The $N^{th}$ data latch 21_N may include NMOS transistors 211_N, 212_N, 217_N, and 218_N and inverters 214_N and 215_N. The NMOS transistor 211_N may be connected between the node n201 and a node n211_N and may be turned on when a pulse of a $N^{th}$ bit PIN<N> that is included in the input control signal PIN is generated. The input data DIN input through the node n201 may be transferred to the node n211_N and latched when the NMOS transistor 211_N is turned on. The NMOS transistor 212_N may be connected between the node n203 and a node n213_N and may be turned on when a pulse of the $N^{th}$ bit PIN<N> that is included in the input control signal PIN is generated. The inverted input data DINB of the node n203 may be transferred to the node n213_N and latched when the NMOS transistor 212_N is turned on. The inverter 214_N may inversely buffer the signal of the node n211_N and output an inversely buffered signal to the node n213_N. The inverter 215_N may inversely buffer the signal of the node n213_N and output an inversely buffered signal to the node n211_N. The inverters 214_N and 215_N may latch the signal of the node n211_N and the signal of the node n213_N. The NMOS transistor 217_N may be connected between the node n213_N and the node n221 and may be turned on when a pulse of a $N^{th}$ bit POUT<N> that is included in the output control signal POUT is generated. The inverted input data DINB latched to the node n213_N may be output as the inverted latch data LDB of the node n221 when the NMOS transistor 217_N is turned on. The NMOS transistor 218_N may be connected between the node n211_N and the node n223 and may be turned on when a pulse of the $N^{th}$ bit POUT<N> that is included in the output control signal POUT is generated. The input data DIN latched to the node n211_N may be output as the latch data LD when the NMOS transistor 218_N is turned on.

The data latch circuit 171 may latch the input data DIN and the inverted input data DINB when the pulse of the first bit PIN<1> of the input control signal PIN is generated and may output the latched input data DIN and inverted input data DINB as the latch data LD and the inverted latch data LDB when the pulse of the first bit POUT<1> of the output control signal POUT is generated. In addition, the data latch circuit 171 may latch the input data DIN and the inverted input data DINB when a pulse of the second bit PIN<2> of the input control signal PIN is generated and may output the latched input data DIN and inverted input data DINB as the latch data LD and the inverted latch data LDB when a pulse of the second bit POUT<2> of the output control signal POUT is generated. Similarly, the data latch circuit 171 may latch the input data DIN and the inverted input data DINB when the pulse of the $N^{th}$ bit PIN<N> of the input control signal PIN is generated and may output the latched input data DIN and inverted input data DINB as the latch data LD and the inverted latch data LDB when the pulse of the $N^{th}$ bit POUT<N> of the output control signal POUT is generated.

Figure 3:
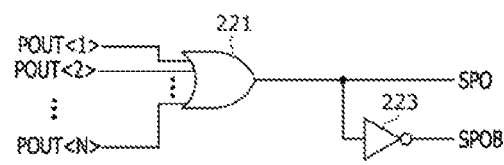
FIG. 3 is a circuit diagram according to an embodiment of a sum output control signal generation circuit that is included in the semiconductor device illustrated in FIG. 1.

FIG. 3 is a circuit diagram according to an embodiment of a sum output control signal generation circuit 173. As illustrated in FIG. 3, the sum output control signal generation circuit 173 may include an OR gate 221 and an inverter 223. The OR gate 221 may receive a first bit POUT<1> of the output control signal POUT to an $N^{th}$ bit POUT<N> of the output control signal POUT to perform an OR operation. The OR gate 221 may generate a sum output control signal SPO with a pulse that is generated at a logic "high" level when at least one of the bits from the first bit POUT<1> of the output control signal POUT to the $N^{th}$ bit POUT<N> of the output control signal POUT is generated at a logic "high" level. The inverter 223 may inversely buffer the sum output control signal SPO to generate an inverted sum output control signal SPOB. The sum output control signal generation circuit 173 may generate the sum output control signal SPO with a pulse that is generated at a logic "high" level and the inverted sum output control signal SPOB with a pulse that is generated at a logic "low" level when at least one of the bits from the first bit POUT<1> of the output control signal POUT to the Nth bit POUT<N> of the output control signal POUT is generated at a logic "high" level.

Figure 4:
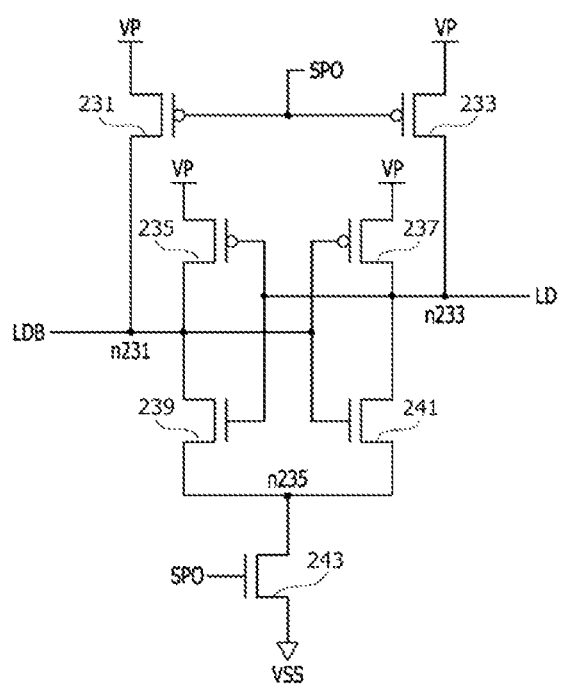
FIG. 4 is a circuit diagram according to an embodiment of a sense amplification circuit that is included in the semiconductor device illustrated in FIG. 1.

FIG. 4 is a circuit diagram according to an embodiment of a sense amplification circuit 175. As illustrated in FIG. 4, the sense amplification circuit 175 may include PMOS transistors 231, 233, 235, and 237 and NMOS transistors 239, 241, and 243.

The PMOS transistor 231 may be connected between a drive voltage VP and a node n231 and may be turned on based on a sum output control signal SPO. When the sum output control signal SPO is set to have a logic "low" level, the PMOS transistor 231 may be turned on to drive the inverted latch data LDB that is output from the node n231 to the drive voltage VP. The PMOS transistor 233 may be connected between the drive voltage VP and a node n233 and may be turned on based on the sum output control signal SPO. When the sum output control signal SPO is set to have a logic "low" level, the PMOS transistor 233 may be turned on to drive the latch data LD that is output from the node n233 to the drive voltage VP. The drive voltage VP may be set to a power voltage VDD that is applied from an external device (not illustrated) of the semiconductor device 100 or may be set to an internal voltage that is generated from the power voltage VDD according to embodiments.

The PMOS transistor 235 may be connected between the drive voltage VP and the node n231 and may be turned on based on the latch data LD. The PMOS transistor 235 may be turned on when the level of the latch data LD is set to be lower than the level of the inverted latch data LDB by a preset sensing level or a level that is higher than the preset sensing level to drive the inverted latch data LDB to the drive voltage VP. The PMOS transistor 237 may be connected between the drive voltage VP and the node n233 and may be turned on based on the inverted latch data LDB of the node n231. The PMOS transistor 237 may be turned on when the level of the inverted latch data LDB is set to be lower than the level of the latch data LD by a preset sensing level or a level that is higher than the preset sensing level to drive the latch data LD to the drive voltage VP.

The NMOS transistor 239 may be connected between the node n231 and the node n235 and may be turned on based on the latch data LD. The NMOS transistor 241 may be connected between the node n233 and the node n235 and may be turned on based on the inverted latch data LDB. The NMOS transistor 243 may be connected between the node n235 and a ground voltage VSS and may be turned on based on the sum output control signal SPO. The NMOS transistor 243 may be turned on when a pulse that is set to have a logic "high" level of the sum output control signal SPO is generated. The NMOS transistor 239 may be turned on to drive the inverted latch data LDB to the ground voltage VSS when the level of the latch data LD is set to be higher than the level of the inverted latch data LDB by a preset sensing level or a level that is higher than the preset sensing level while the NMOS transistor 243 is turned on. The NMOS transistor 241 may be turned on to drive the latch data LD to the ground voltage VSS when the level of the inverted latch data LDB is set to be higher than the level of the latch data LD by a preset sensing level or a level that is higher than the preset sensing level while the NMOS transistor 243 is turned on.

The sense amplification circuit 175 may sense and amplify the latch data LD and the inverted latch data LDB when the level difference between the latch data LD and the inverted latch data LDB is set to a preset sensing level or a level that is higher than the preset sensing level. As an example, the sense amplification circuit 175 may sense the level difference between the latch data LD and the inverted latch data LDB to drive the latch data LD to the drive voltage VP and to drive the inverted latch data LDB to the ground voltage VSS when the level of the latch data LD is set to be higher than the level of the inverted latch data LDB by a preset sensing level or a level that is higher than the preset sensing level. The preset sensing level may be set according to the sizes of the PMOS transistors 231, 233, 235, and 237 and the NMOS transistors 239, 241, and 243 and PVT (process, voltage, temperature) characteristics. As another example, the sense amplification circuit 175 may sense the level difference between the latch data LD and the inverted latch data LDB to drive the latch data LD to the ground voltage VSS and to drive the inverted latch data LDB to the drive voltage VP when the level of the inverted latch data LDB is set to be higher than the level of the latch data LD by a preset sensing level or a level that is higher than the preset sensing level.

Figure 5:
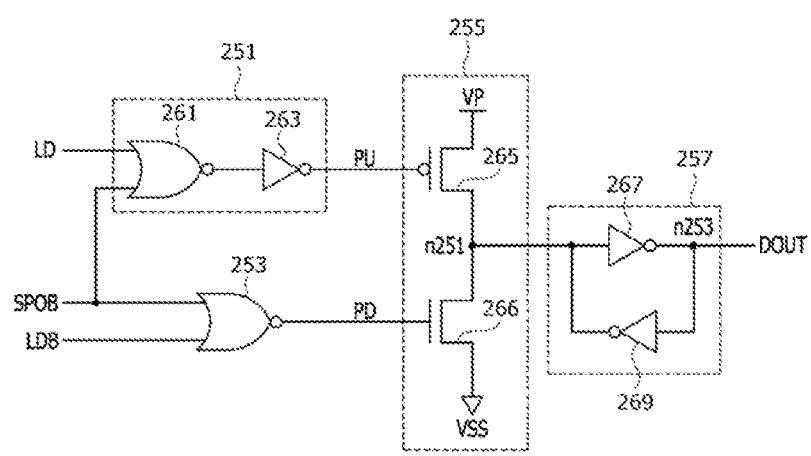
FIG. 5 is a circuit diagram according to an embodiment of a data driving circuit that is included in the semiconductor device illustrated in FIG. 1.

FIG. 5 is a circuit diagram according to an embodiment of a data driving circuit 177. As illustrated in FIG. 5, the data driving circuit 177 may include a pull-up signal generator 251, a pull-down signal generator 253, a driver 255, and an output latch 257.

The pull-up signal generator 251 may include a NOR gate 261 and an inverter 263 and may perform an OR operation for an inverted sum output control signal SPOB and a latch data LD to generate a pull-up signal PU. The pull-up signal generator 251 may generate the pull-up signal PU that is activated to a logic "low" level when the latch data LD is driven to a logic "low" level while a pulse that is set to a logic "low" level of the inverted sum output control signal SPOB is generated. The pull-down signal generator 253 may be implemented with a NOR gate that performs a NOR operation and may perform a NOR operation for the inverted sum output control signal SPOB and the inverted latch data LDB to generate the pull-down signal PD. The pull-down signal generator 253 may generate the pull-down signal PD that is activated to a logic "low" level when the inverted latch data LDB is driven to a logic "low" level while the pulse that is set to have a logic "low" level of the inverted sum output control signal SPOB is generated. The driver 255 may include a PMOS transistor 265 and an NMOS transistor 266. The PMOS transistor 265 may be connected between the drive voltage VP and a node n251 and may drive the node n251 to the drive voltage VP when the pull-up signal PU is activated to a logic "low" level. The NMOS transistor 266 may be connected between the node n251 and the ground voltage VSS and may drive the node n251 to the ground voltage VSS when the pull-down signal PD is activated to a logic "high" level. The output latch 257 may include inverters 267 and 269. The output latch 257 may inversely buffer the signal of the node 251 and output an inversely buffered signal as output data DOUT of a node n253. The output latch 257 may latch the signal of the node 251 and the signal of the node n253.

The data driving circuit 177 may drive the output data DOUT when the logic levels of the latch data LD and the inverted latch data LDB sensed and amplified by the sense amplification circuit 175 are driven to inverted logic levels while the pulse that is set to have a logic "low" level of the inverted sum output control signal SPOB is generated. As an example, the data driving circuit 177 may drive the output data DOUT to a logic "high" level when the latch data LD is set to have a logic "high" level and the inverted latch data LDB is set to have a logic "low" level when the pulse that is set to have a logic "low" level of the inverted sum output control signal SPOB is generated. As another example, the data driving circuit 177 may drive the output data DOUT to have a logic "low" level when the latch data LD is set to have a logic "low" level and the inverted latch data LDB is set to have a logic "high" level while a pulse that is set to have a logic "low" level of the inverted sum output control signal SPOB is generated.

The operations of the semiconductor device 100 configured as described above will be described with reference to FIGS. 6 to 16 as follows.

Figure 6:
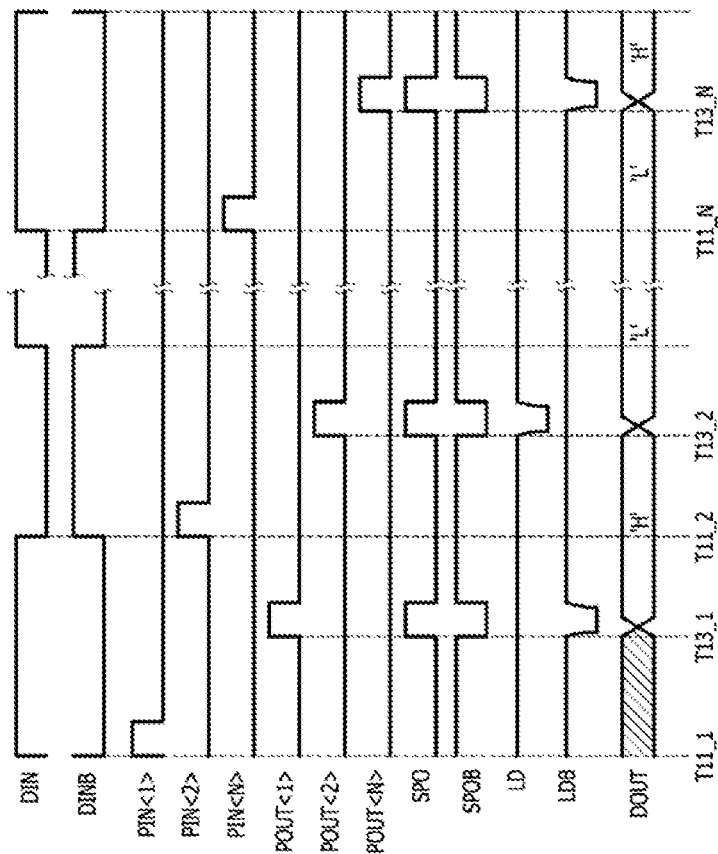
FIGS. 6 to 16 are diagrams illustrating an operation of the semiconductor device described in FIGS. 1 to 5.
Figure 7:
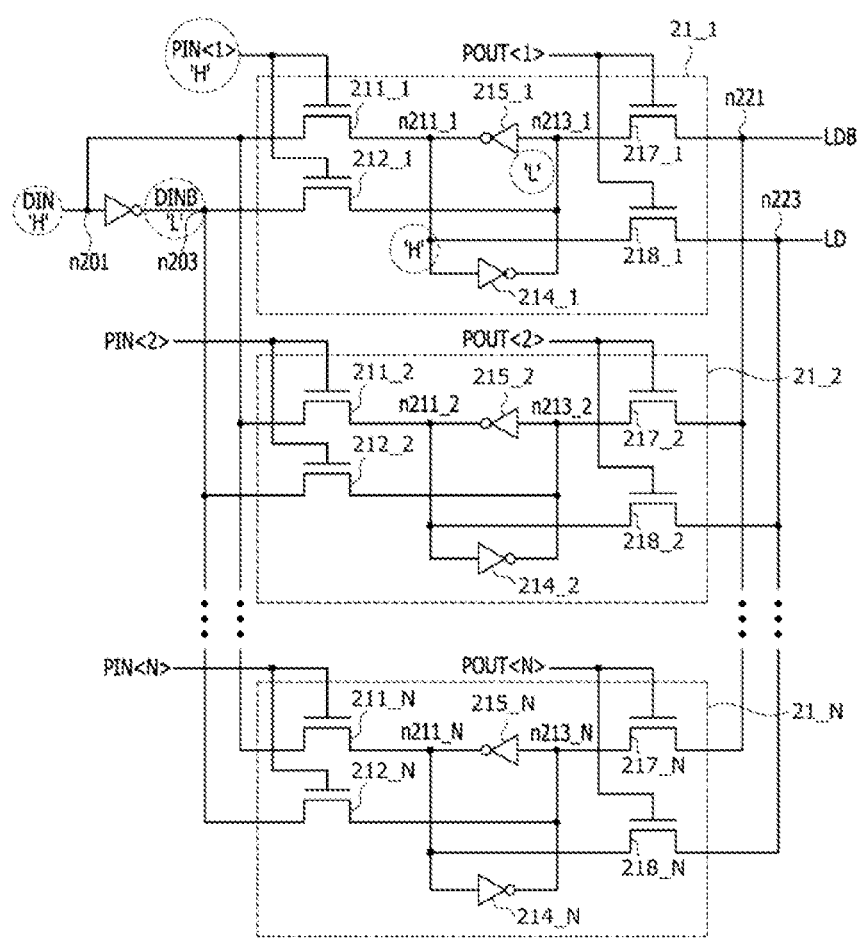

First, as illustrated in FIGS. 6 and 7, when a pulse that is set to have a logic "high" level 'H' of a first bit PIN<1> of an input control signal PIN is generated at time T11_1, the input data DIN that is set to have a logic "high" level 'H' is transferred to a node n211_1 and latched, and an inverted input data DINB set to have a logic "low" level 'L' may be transferred to a node n213_1 and latched.

Figure 8:
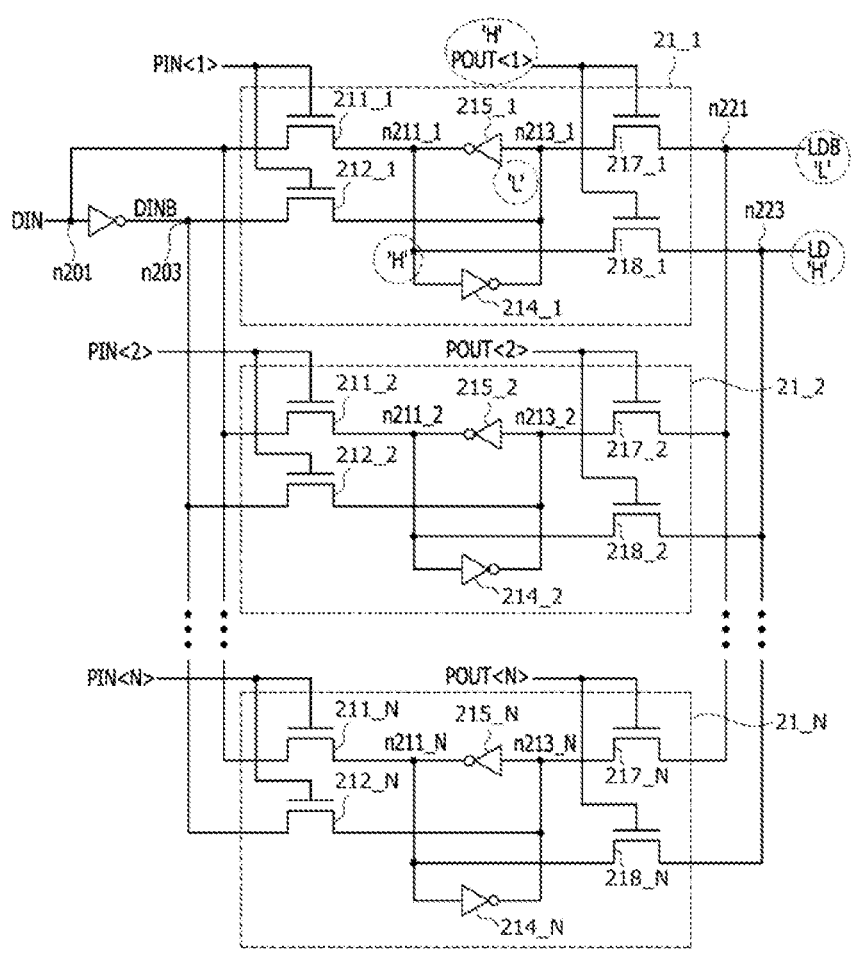

Next, as illustrated in FIGS. 6 and 8, when a pulse that is set to have a logic "high" level 'H' of a first bit POUT<1> of an output control signal POUT is generated at time T13_1, the latch data LD set to have a logic "high" level 'H' may be generated according to the logic "high" level 'H' of the input data DIN latched to the node n211_1, and the inverted latch data LDB set to have a logic "low" level 'L' may be generated according to the logic "low" level 'L' of the inverted input data DINB latched to the node n213_1.

Figure 9:
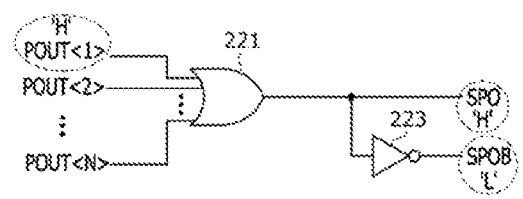

Next, as illustrated in FIGS. 6 and 9, when a pulse that is set is to have a logic "high" level 'H' of the first bit POUT<1> of the output control signal POUT is generated at time T13_1, a sum output control signal SPO with a pulse that is set to have a logic "high" level 'H' may be generated, and an inverted sum output control signal SPOB with a pulse that is set to have a logic "low" level 'L' may be generated.

Figure 10:
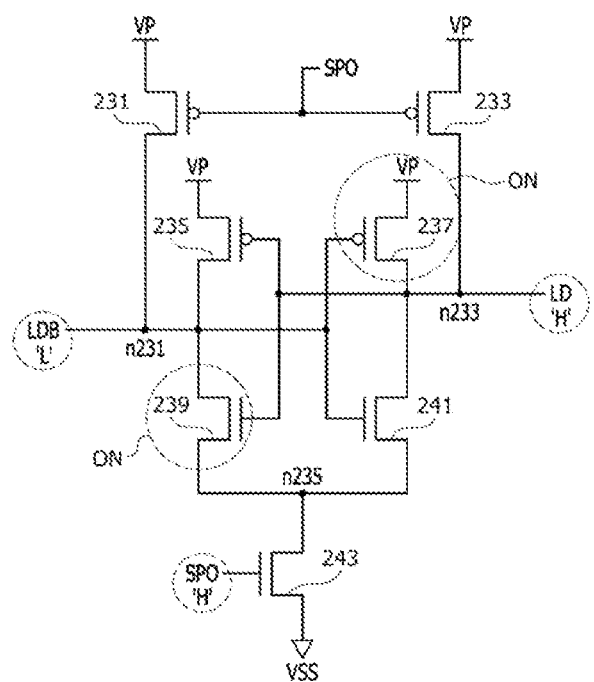

Next, as illustrated in FIGS. 6 and 10, when the level of the inverted latch data LDB is set to be lower than the level of the latch data LD by a preset sensing level or a level that is higher than the preset sensing level while a pulse that is set to have a logic "high" level 'H' of the sum output control signal SPO is generated, the latch data LDB may be amplified by the NMOS transistor 237, which is turned on by sensing the level of the inverted latch data LDB, and may be generated to have a logic "high" level 'H'. In addition, when the level of the latch data LD is set to be higher than the level of the inverted latch data LDB by a preset sensing level or a level that is higher than the preset sensing level while a pulse that is set to have a logic "high" level 'H' of the sum output control signal SPO is generated, the inverted latch data LDB may be amplified by the NMOS transistor 239, which is turned on by sensing the level of the latch data LD, and may be generated to have a logic "low" level 'L'.

Figure 11:
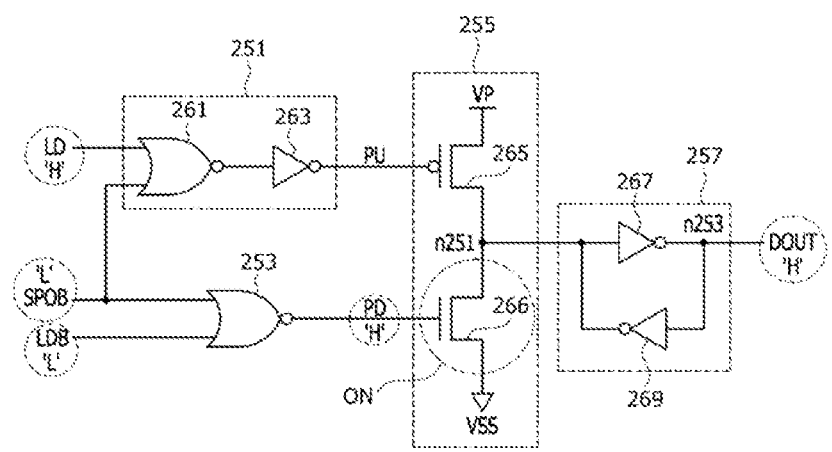

Next, as illustrated in FIGS. 6 and 11, when the latch data LD is generated to have a logic "high" level 'H' and the inverted latch data LDB is generated to have a logic "low" level 'L' while a pulse that is set to have a logic "low" level 'L' of the inverted sum output control signal SPOB is generated, the NMOS transistor 266 may be turned on to generate output data DOUT set to have a logic "high" level 'H'.

Figure 12:
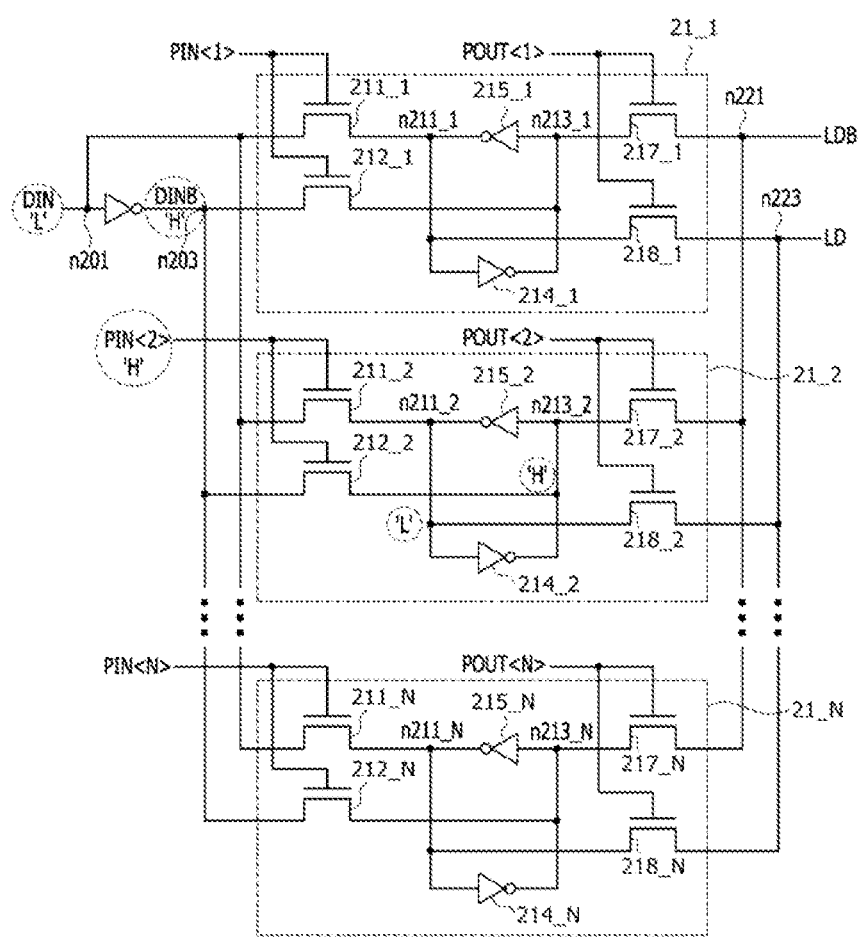

Next, as illustrated in FIGS. 6 and 12, when a pulse that is set to have a logic "high" level 'H' of the second bit PIN<2> of the input control signal PIN is generated at time T11_2, the input data DIN set to have a logic "low" level 'L' may be transferred to the node n211_2 and latched, and the inverted input data DINB set to have a logic "high" level 'H' may be transferred to the node n213_2 and latched.

Figure 13:
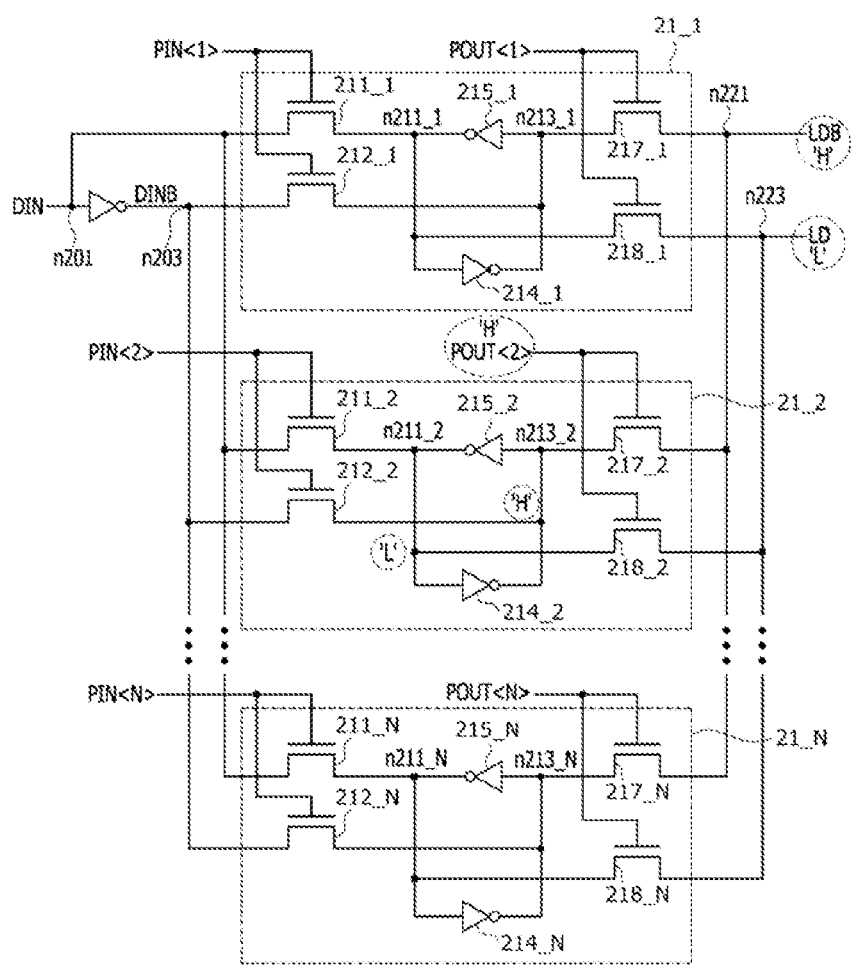

Next, as illustrated in FIGS. 6 and 13, when a pulse that is set to have a logic "high" level 'H' of the second bit POUT<2> of the output control signal POUT is generated at time T13_2, the latch data LD set to have a logic "low" level 'L' may be generated according to the logic "low" level 'L' of the input data DIN that is latched in the node n211_2, and the inverted latch data LDB set to have a logic "high" level 'H' may be generated according to the logic "high" level 'H' of the inverted input data DINB that is latched in the node n213_2.

Figure 14:
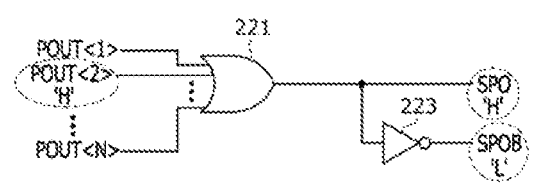

Next, as illustrated in FIGS. 6 and 14, when a pulse that is set to have a logic "high" level 'H' of the second bit POUT<2> of the output control signal POUT is generated at time T13_2, the sum output control signal SPO with a pulse that is set to have a logic "high" level 'H' may be generated, and the inverted sum output control signal SPOB with a pulse that is set to have a logic "low" level 'L' may be generated.

Figure 15:
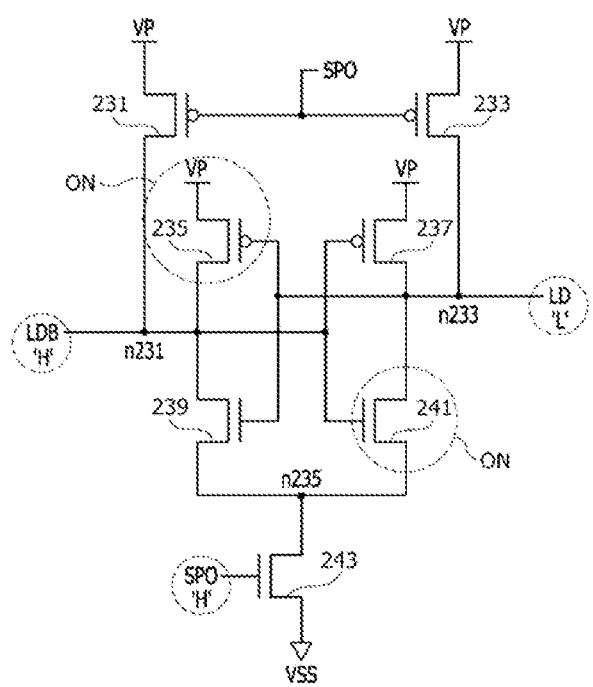

Next, as illustrated in FIGS. 6 and 15, when the level of the latch data LD is set to be lower than the level of the inverted latch data LDB by a preset sensing level or a level that is higher than the preset sensing level while a pulse that is set to have a logic "high" level 'H' of the sum output control signal SPO is generated, the inverted latch data LDB may be amplified by the PMOS transistor 235, which is turned on by sensing the level of the latch data LD, and may be generated to have a logic "high" level 'H'. In addition, when the level of the inverted latch data LDB is set to be higher than the level of the latch data LD by a preset sensing level or a level that is higher than the preset sensing level in a state while the pulse that is set to have a logic "high" level 'H' of the sum output control signal SPO is generated, the level of the inverted latch data LDB may be amplified by NMOS transistor 241, which is turned-on by sensing the latch data LD, and may be generated to have a logic "low" level 'L'.

Figure 16:
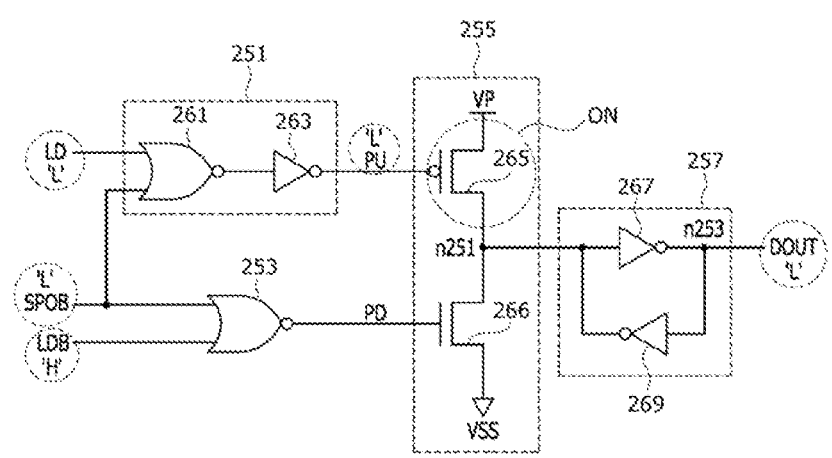

Next, as illustrated in FIGS. 6 and 16, when the inverted latch data LDB is generated to have a logic "high" level 'H' and the latch data LD is generated to have a logic "low" level 'L' while a pulse that is set to have a logic "low" level 'L' of the inverted sum output control signal SPOB is generated, the PMOS transistor 265 may be turned on to generate an output data DOUT that is set to have a logic "low" level 'L'.

Next, as illustrated in FIG. 6, when a pulse that is set to have a logic "high" level 'H' of an $N^{th}$ bit PIN<N> of the input control signal PIN is generated at time T11_N, the input data DIN that is set to have a logic "high" level 'H' may be latched, and the inverted input data DINB that is set to have a logic "low" level 'L' may be latched.

Next, as illustrated in FIG. 6, when a pulse that is set to have a logic "high" level 'H' of an $N^{th}$ bit POUT<N> of the output control signal POUT is generated at time T13_N, the latch data LD that is set to have a logic "high" level 'H' may be generated, and the inverted latch data LDB that is set to have a logic "low" level 'L' may be generated.

Next, as illustrated in FIG. 6, when a pulse that is set to have a logic "high" level 'H' of the Nth bit POUT<N> of the output control signal POUT is generated at the time T13_N, a sum output control signal SPO with a pulse that is set to have a logic "high" level 'H' may be generated, and an inverted sum output control signal SPOB with a pulse that is set to have a logic "low" level 'L' may be generated.

Next, as illustrated in FIG. 6, when the level of the inverted latch data LDB is set to be lower than the level of the latch data LD by a preset sensing level or a level that is higher than the preset sensing level while a pulse that is set to have a logic "high" level 'H' of the sum output control signal SPO is generated, the sensed and amplified latch data LD may be generated to have a logic "high" level 'H'. In addition, when the level of the latch data LD is set to be higher than the level of the inverted latch data LDB by a preset sensing level or a level that is higher than the preset sensing level while a pulse that is set to have a logic "high" level 'H' of the sum output control signal SPO is generated, the sensed and amplified inverted latch data LDB may be generated to have a logic low level 'L'.

Next, as illustrated in FIG. 6, when the latch data LD is generated to have a logic "high" level 'H' and the inverted latch data LDB is generated to have a logic "low" level 'L' while the pulse that is set to have a logic "low" level 'L' of the inverted sum output control signal SPOB is generated, the output data DOUT that is set to have a logic "high" level 'H' may be generated.

The semiconductor device 100, described above, may drive the output data DOUT at a high speed based on the latch data LD and the inverted latch data LDB that are sensed and amplified by the sense amplification circuit 175 when the level difference between the latch data LD and the inverted latch data LDB is set to a preset sensing level or a level that is higher than the preset sensing level. Therefore, even if the number of the data latches that are included in the data latch circuit 171 increases and the loading of the output node to which the data latches are connected increases, if the level difference between the latch data LD and the inverted latch data LDB occurs only above the preset sensing level, the semiconductor device 100 may quickly drive the output data DOUT.

Figure 17:
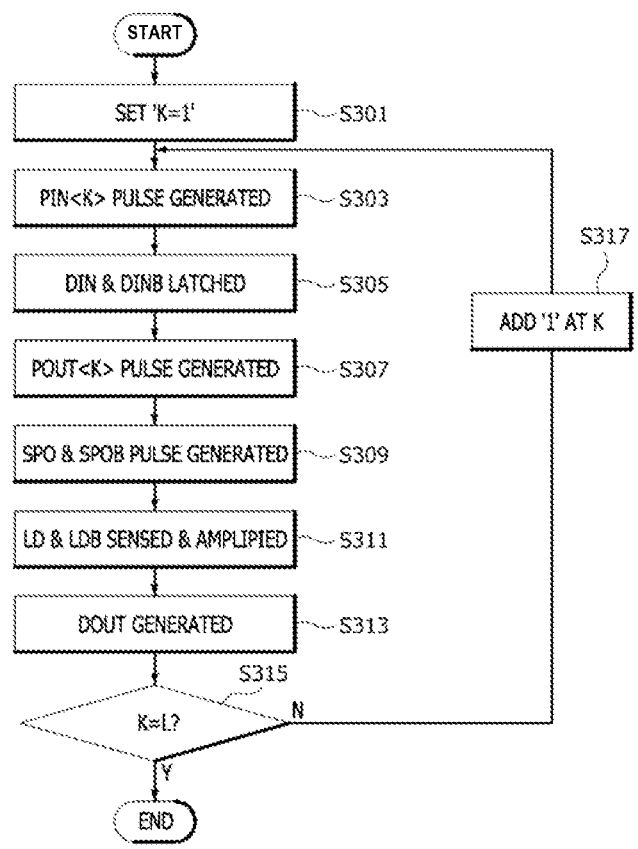
FIG. 17 is a timing diagram illustrating a consecutive data output operation of a pipe latch circuit that is included in a semiconductor device.

FIG. 17 is a timing diagram illustrating a consecutive data output operation of a pipe latch circuit 17 that is included in a semiconductor device 100.

First, in a state in which K is set to 1 (S301), when a pulse of a $K^{th}$ bit PIN<K> of an input control signal PIN is generated (S303), an input data DIN and an inverted input data DINB may be latched (S305).

Next, when a pulse of the $K^{th}$ bit POUT<K> of an output control signal POUT is generated (S307), the pulses of a sum output control signal SPO and an inverted sum output control signal SPOB may be generated, and the latch data LD and the inverted latch data LDB may be sensed and amplified (S311). The output data DOUT may be generated based on the sensed and amplified latch data LD and inverted latch data LDB (S313).

Next, it is determined whether K is the same as the number L of the data latches that are included in the pipe latch circuit 17 (S315). When K is not equal to L, 1 may be added to K (S317), and operations from steps S303 to S313 may be repeatedly performed. When K is equal to L, because the data that is latched to all the data latches that are included in the pipe latch circuit 17 is output as the output data DOUT, the operation of the pipe latch circuit 17 may be terminated.

The concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the concepts is not limited to the above descriptions but defined by the accompanying claims, and all of distinctive features in the equivalent scope should be construed as being included in the concepts.

What is claimed is:

1. A pipe latch circuit comprising;
   a data latch circuit configured to latch an input data based on an input control signal and output the latched input data as a latch data based on an output control signal;
   a sense amplification circuit configured to sense and amplify the latch data based on a sum output control signal; and
   a data driving circuit configured to drive an output data from the latch data based on the sum output control signal,
   wherein the sum output control signal is generated from the output control signal.

2. The pipe latch circuit of claim 1,
   wherein the data latch circuit latches the input data to a first node when a pulse of a first bit of the input control signal is generated and outputs the input data that is latched to the first node as the latch data when a pulse of a first bit of the output control signal is generated.

3. The pipe latch circuit of claim 2,
   wherein the data latch circuit latches the input data to a $K^{th}$ node when a pulse of a $K^{th}$ bit of the input control signal is generated and outputs the input data that is latched to the $K^{th}$ node as the latch data when a pulse of a $K^{th}$ bit of the output control signal is generated, the 'K' being a natural number of 2 or more.

4. The pipe latch circuit of claim 1, further comprising a sum output control signal generation circuit configured to generate the sum output control signal with a pulse that is generated when a pulse of at least one bit among the bits that are included in the output control signal is generated.

5. The pipe latch circuit of claim 1,
   wherein the data latch circuit inversely buffers the input data to generate an inverted input data, latches the inverted input data based on the input control signal, and outputs the latched inverted input data as an inverted latch data based on the output control signal.

6. The pipe latch circuit of claim 5,
   wherein the sense amplification circuit drives the latch data to a drive voltage and drives the inverted latch data to a ground voltage when a level of the latch data is set to be higher than a level of the inverted latch data by a preset sensing level or a level that is higher than the preset sensing level.

7. The pipe latch circuit of claim 5,
   wherein the sense amplification circuit drives the inverted latch data to a drive voltage and drives the latch data to a ground voltage when the level of the inverted latch data is set to be higher than the level of the latch data by a preset sensing level or a level that is higher than the preset sensing level.

8. The pipe latch circuit of claim 5,
   wherein the sense amplification circuit senses and amplifies the latch data and the inverted latch data when a pulse of the sum output control signal is generated.

9. The pipe latch circuit of claim 5,
   wherein the data driving circuit drives the output data based on the latch data and the inverted latch data when a pulse of an inverted sum output control signal that is generated by inversely buffering the sum output control signal is generated.

10. The pipe latch circuit of claim 9,
    wherein the data driving circuit generates a pull-up signal based on the inverted sum output control signal and the latch data, generates a pull-down signal based on the inverted sum output control signal and the inverted latch data, and drives the output data based on the pull-up signal and the pull-down signal.

11. A pipe latch circuit comprising:
a first data latch configured to latch an input data to a first node when a pulse of a first bit of an input control signal is generated and output the input data that is latched to the first node as a latch data when a pulse of a first bit of an output control signal is generated;
a second data latch configured to latch the input data to a second node when a pulse of a second bit of the input control signal is generated and output the input data that is latched to the second node as the latch data when a pulse of a second bit of the output control signal is generated; and
a sense amplification circuit configured to sense and amplify the latch data to drive an output data based on a sum output control signal, wherein the sum output control signal is generated from the output control signal.

12. The pipe latch circuit of claim 11, further comprising a sum output control signal generation circuit configured to generate the sum output control signal with a pulse that is generated when at least one of the pulse of a first bit that is included in the output control signal or a pulse of a second bit that is included in the output control signal is generated.

13. The pipe latch circuit of claim 11,
wherein the first data latch circuit inversely buffers the input data to generate an inverted input data, latches the inverted input data to a third node when a pulse of the first bit of the input control signal is generated, and outputs the inverted input data that is latched to the third node as an inverted latch data when a pulse of the first bit of the output control signal is generated.

14. The pipe latch circuit of claim 13,
wherein the second data latch circuit inversely buffers the input data to generate the inverted input data, latches the inverted input data to a fourth node when a pulse of the second bit of the input control signal is generated, and outputs the inverted input data that is latched to the fourth node as the inverted latch data when a pulse of the second bit of the output control signal is generated.

15. The pipe latch circuit of claim 13,
wherein the sense amplification circuit drives the latch data to a drive voltage and drives the inverted latch data to a ground voltage when a level of the latch data is set to be higher than a level of the inverted latch data by a preset sensing level or a level that is higher than the preset sensing level.

16. The pipe latch circuit of claim 13,
wherein the sense amplification circuit drives the inverted latch data to a drive voltage and drives the latch data to a ground voltage when the level of the inverted latch data is set to be higher than the level of the latch data by a preset sensing level or a level that is higher than the preset sensing level.

17. The pipe latch circuit of claim 13,
wherein the sense amplification circuit senses and amplifies the latch data and the inverted latch data when a pulse of the sum output control signal is generated.

18. The pipe latch circuit of claim 13, further comprising a data driving circuit configured to drive the output data based on the latch data and the inverted latch data when a pulse of the inverted sum output control signal that is generated by inversely buffering the sum output control signal is generated.

19. The pipe latch circuit of claim 18,
wherein the data driving circuit generates a pull-up signal based on the inverted sum output control signal and the latch data, generates a pull-down signal based on the inverted sum output control signal and the inverted latch data, and drives the output data based on the pull-up signal and the pull-down signal.

20. A method of executing consecutive data output operations comprising:
latching an input data and an inverted input data based on an input control signal, outputting the latched input data as a latch data based on an output control signal, and outputting the latched inverted input data as an inverted latch data;
sensing and amplifying the latch data and the inverted latch data based on a sum output control signal; and
driving an output data based on the latch data, the inverted latch data, and the sum output control signal,
wherein the sum output control signal is generated from the output control signal.

* * * * *